United States Patent [19]

Miller et al.

[11] Patent Number: 4,804,917
[45] Date of Patent: Feb. 14, 1989

[54] CURRENT DETECTION DEVICE HAVING AN EXTENDED FREQUENCY RANGE OF RESPONSE

[75] Inventors: John S. Miller, Los Angeles; Michael K. Van Brunt, Ventura, both of Calif.

[73] Assignee: G & H Technology, Inc., Santa Monica, Calif.

[21] Appl. No.: 127,185

[22] Filed: Dec. 1, 1987

Related U.S. Application Data

[62] Division of Ser. No. 885,271, Jul. 14, 1986, Pat. No. 4,719,414.

[51] Int. Cl.$^4$ .......................... G01R 21/04; G01R 1/20
[52] U.S. Cl. ...................................... 324/95; 324/126; 324/127; 336/174
[58] Field of Search .......................... 324/95, 126, 127; 336/174; 333/22 R, 245; 329/203, 205 R; 307/309; 328/1, 5

[56] References Cited

U.S. PATENT DOCUMENTS 2,496,541  2/1950  Johnson, Jr. ............................ 324/95
2,968,774  1/1961  Rodriguez ........................ 333/22 R

FOREIGN PATENT DOCUMENTS 954559  4/1964  United Kingdom .................. 324/95

Primary Examiner—Ernest F. Karlsen
Attorney, Agent, or Firm—George J. Netter

[57] ABSTRACT

A current detection device has an annular dielectric substrate with a thin (e.g., less than one skin depth at maximum frequency) resistive foil laid down on the substrate outer surface and extending completely thereabout. Annular metal rims are affixed to the substrate edges respectively contacting the metal foil or film. A conductive strip of appropriate dimensions is received onto the outer edges of the metal rims and extends about the complete circumference of the rims. A resistive material is used to secure the conductive strip to the edges of the rims so that the entire resistance of the strip and resistance material exceeds that of the sensing metal foil to prevent shorting out of the foil.

2 Claims, 1 Drawing Sheet

CURRENT DETECTION DEVICE HAVING AN EXTENDED FREQUENCY RANGE OF RESPONSE

This is a division, of application Ser. No. 885,271, filed July 14, 1986, now U.S. Pat. No. 4,719,414.

FIELD OF THE INVENTION

The present invention relates generally to a device for detecting and measuring the magnitude of an electric current passing along a coaxial conductor, and, more particularly, to such a device capable of detecting and measuring electric current over an extended frequency range and in a non-invasive manner.

BACKGROUND OF THE INVENTION

The detection and measurement of electric currents through application of the general principle of induction is well known, as exemplified by clamp-on meters used for relatively low frequency current measurement. Briefly, these known devices incorporate a magnetic material loop arranged to encircle a current carrying conductor, which loop has an electric potential induced therein that can be detected by a galvanometer, the latter being optionally calibrated for direct readout. At low frequencies, these devices have found wide use and are relatively insensitive to secondary inductions and do not require precise location of the current carrying conductor with respect to any of the detection equipment parts.

However, as the frequency of the current being measured increases, various factors which can be substantially ignored at lower frequencies must now be taken into account in order to obtain accurate determinations. First of all, although conductor resistance loss is responsible for most of the attenuation at low frequencies, at higher frequencies dielectric loss is the primary cause of attenuation. Moreover, the series resistance of a radio frequency (or higher) line is controlled by a physical phenomenon referred to as "skin effect" and it can be shown to be proportional to the square root of the frequency. Still further, the coaxial characteristic impedance is substantially independent of frequency ranging between 20-300 ihms for coaxial conductors or transmission lines. The combined effect of all of these factors makes current detection and measurement more difficult as the frequency increases.

In addition to desiring to unobtrusively determine the magnitude of coaxial transmission line current, there are situations in which it is advantageous to be able to test the effectiveness of such apparatus as cable termination means. Exemplary of what is referred to here, there are many environments (e.g., aboard a ship) where shielded cables are exposed to relatively large interference electromagnetic fields which induce correspondingly large interference currents in the cable shield. If these currents are not terminated satisfactorily, they can impair or even destroy the equipment to which the cables are connected. Termination means of considerable variety have been devised to achieve termination for cables as well as other equipment and devices, and it is a desideratum to have non-invasive test equipment which can determine the effectiveness of a particular termination or grounding device prior to its installation and actual on site utilization. An essential part of apparatus for measuring termination means effectiveness is a wide range electrical current detection and measurement device as described herein.

OBJECTS AND SUMMARY OF THE INVENTION

It is, therefore, a primary object and aim of the present invention to provide a coaxial current detection device having an exceptional wide range of frequency response, namely, D.C. to 1 gigahertz.

Another object is the provision of a current detection and measurement device which is incorporated into a test arrangement for termination apparatus.

In accordance with the practice of the described invention, a current detection device is provided including an annular dielectric substrate with a thin (e.g., less than one skin depth at maximum frequency) resistive foil or film laid down on the substrate outer surface and extending completely thereabout. First and second annular metal rims are affixed to the substrate edges respectively contacting the metal foil or film. More particularly, the foil edges are turned up into a plurality of tabs which press against the metal rims. A dielectric member is located over the thin foil or film for protection against physical contact.

A portion of the dielectric member is removed to form a recess within which a resistor is located with one terminal interconnected with one side of the foil and the other terminal of the resistor interconnects with the center lead of a length coaxial cable. The outer conductor of the coaxial cable is connected to the opposite side of the foil. The coaxial cable extends outwardly of the dielectric member for interconnection with a suitable voltage measuring and display means for for measuring the voltage drop developed across the foil.

A conductive strip of appropriate dimensions is received onto the outer edges of the metal rims and extending about the complete circumference of the rims. A resistive material is used to secure the conductive strip to the edges of the rims so that the entire resistance of the strip and resistance material exceeds that of the sensing metal foil to prevent shorting out of the foil.

In use for determining effectivity of a termination means, the annular current detection and measurement device is mounted onto a grounded conductive plate which, in turn, has a termination means conductively secured to the opposite plate surface. Specifically if the termination means is to terminate a cable shield, the termination means will interconnect the cable shield to the plate and the cable will be allowed to extend through an opening in the plate as well as the central opening in the current detecting device. A test voltage is applied to the cable shield on the termination side of the conductive plate. If the termination is lossless, no current will be detected by the described device. If termination is incomplete, some currents in the cable shield will be detected by the device, the value of the currents being a direct measure of the the termination means effectiveness. The return current through the current detection device produces a voltage drop across the metal foil related to the current I on the cable shield by Ohm's law (i.e., $E=IR$) where E is the D.C. voltage output of the device as installed with a known coaxial input of direct current. Accordingly, an unknown test sample can be accurately measured since the device output does not change significantly with frequency.

DESCRIPTION OF A PREFERRED EMBODIMENT

Figure 1:
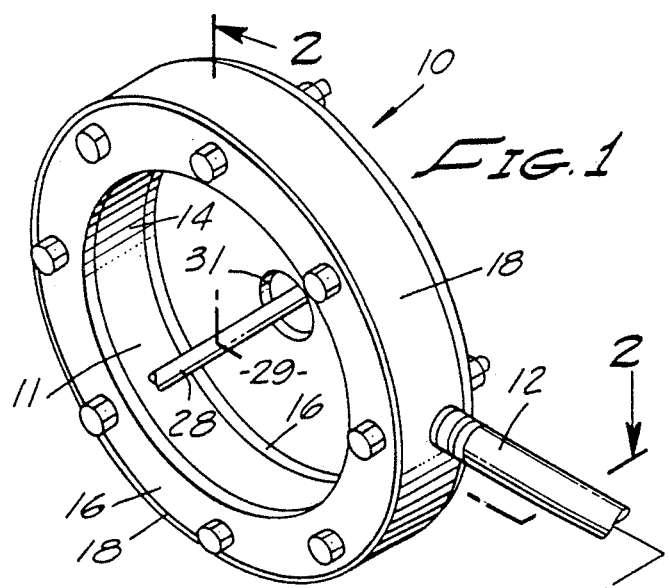
FIG. 1 is a perspective view of the current detection and measurement device of the present invention shown schematically connected to means for displaying current detected.
Figure 4:
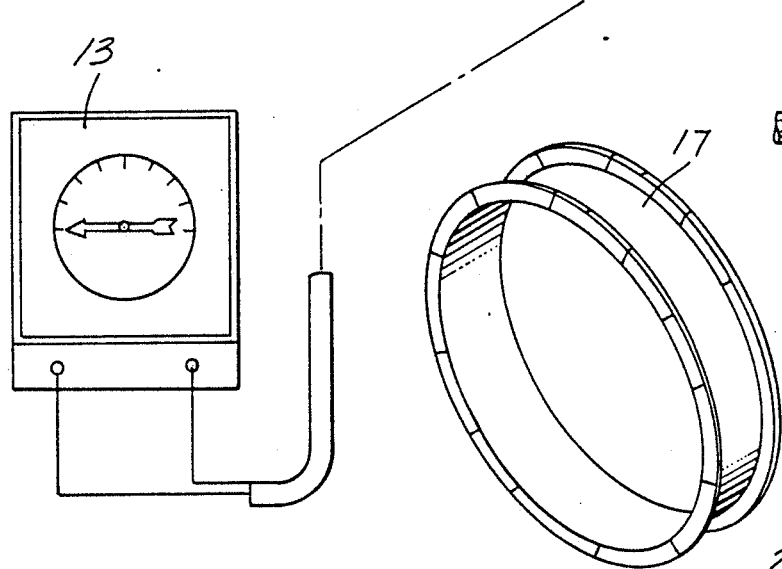
FIG. 4 is a perspective view of the metal foil used in the current detecting and measuring device.
Figure 3:
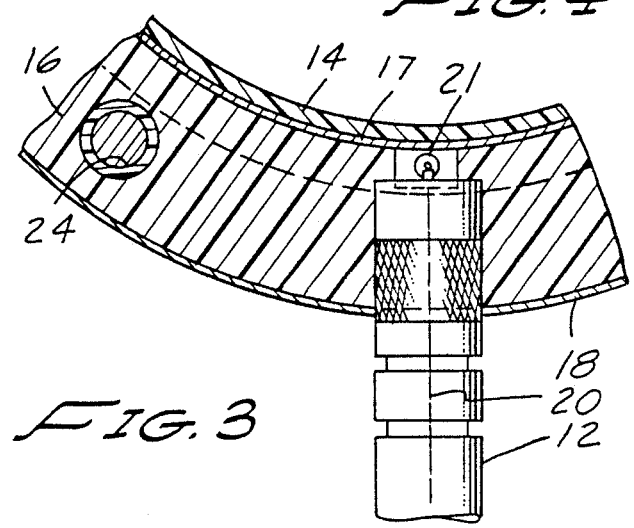
FIG. 3 is a further elevational, sectional view taken through the coaxial connector to the current detecting and measuring device along the line 3—3 of FIG. 2.

Turning now to the drawing and particularly FIG. 1, the current detection device to be described is enumerated generally as 10 and seen to be generally annular in shape and contemplated for detecting and measuring the current of a conductor that extends through the device central opening. A coaxial cable or lead 12 interconnects the device with a voltage measuring and display means 13 which is depicted schematically by a dial instrument. As is well known in the electrical arts, the means 13 may be calibrated for direct readout of electric current.

The current detecting and measuring device 10 has an insulative substrate 14 in the form of a solid flat ring enclosed at each side by metal rims 15 and 16 which extend radially outwardly from the substrate. The substrate can be made in one piece by molding or machining, or in several pieces unitarily related by use of a suitable cementitious material (e.g., epoxy). Also, the substrate may be made of any of a number synthetic plastics or ceramics having good strength and rigidity as well as being a good electrical insulator.

Figure 2:
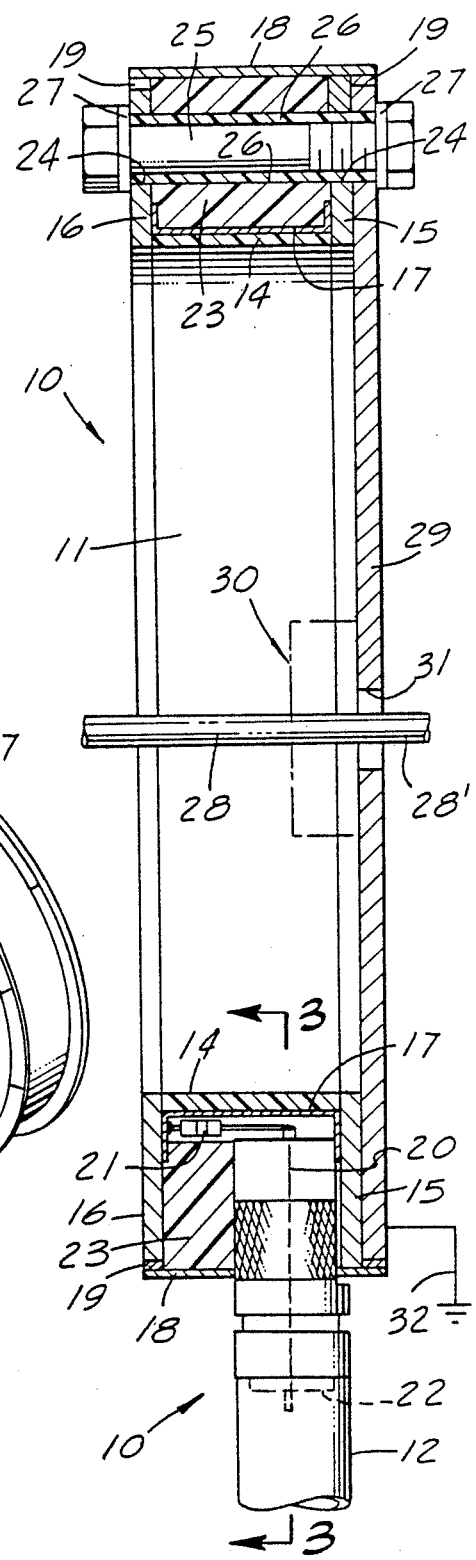
FIG. 2 is a side elevational, sectional view taken along the line 2—2 of FIG. 1.

A thin metal foil or film 17 preferably of a metal such as Inconel (80% Nickel, 14% Chromium and 6% Iron) is laid down on the substrate 14 outer surface and is in intimate contact with the entire surface. In addition, the film or foil edges are turned upwardly in a plurality of slotted tabs which contact the respectively adjacent rims 15 and 16 (FIG. 2). The film or foil thickness should preferably not exceed 0.0005 inches in order to avoid difficulties from dkin effect at higher frequencies and to provide sufficient resistance to produce a significant voltage drop from currents induced in the film by leakage currents. A shielding conductive strip 18 extends across the two rims 15 and 16 and completely about the rims circumference. The strip 18 is secured to the rim edges by a relatively resistive material 19 such that the total resistance measured across the strip width is sufficient so as not to form a short circuit across the rims. The strip is important, however, in preventing stray field inductions in the film 17 which can result from such things as back loops.

Still referring to FIG. 2, the coaxial cable or lead 12 is seen to have its central conductor 20 connected to one edge of the film or foil 17 through a 50-ohm resistor 21. The opposite film edge either connects directly with coaxial cable outer conductor 22 or through the immediately adjacent rim. A quantity of a dielectric material 23 fills the space between the rims and above the film 17. A plurality of aligned openings 24 in the rims 15 and 16 are used in practice receive bolts 25 therethrough which are electrically isolated from the rims by a glass fiber tube 26 and washers 27, for mounting the entire device onto a fixture or the like.

The described current detection and measuring device can be effectively employed for detection of return electric currents passing along a coaxial cable 28 extending through the device opening 11. In a manufacturing or laboratory test mode, it is contemplated that the device will be most extensively employed detecting electric currents in coaxial transmission lines providing a direct measure of the transmission line current by utilizing a diode with a sensitive galvanometer (not shown) mounted directly to the device output coaxial connector 12. In this case, the entire device is preferably packaged with appropriate interconnection means for the applicable coaxial transmission line being monitored.

Exemplary of but one practical employment of the described current detecting and measuring device, a conductive plate 29 of dimensions substantially equal to the outer diameter of the device 10 is secured to one side of the device by a plurality of bolts 25 passed through the device openings 24 and electrically isolated from the rims 15 and 16. The cable 28 having, say, a shield conductively connected (terminated) to the plate 29 by a suitable termination means 30 extends through an opening 31 in the plate as well as through the device opening 11. An excellent termination means of this kind is disclosed in co-pending U.S. patent application Ser. No. 642,170, now abandoned, by M. K. Van Brunt, assigned to the same assignee as the present application.

Then, the incoming cable 28 as well as a return path (not shown) are coaxially connected to an electromagnetic signal, typically a swept frequency source which induces interference electric currents in the cable 28, or more particularly the cable outer shield. Those interference currents not terminated by termination means 30 at plate 29 appear on that part of the cable shield extending within device opening 11, which is further identified as 28'. The plate may be conductively related to other metal parts to prevent creation of loops from the plate 29 through the film 17 to the conductor 28 causing erroneously high current readings. This latter feature is indicated by the ground symbol 32.

Currents present on the cable shield 28' will largely return through the film or foil 17 establishing a voltage drop across the film width that is measured by the meter 13. Ideally, if termination were total, then there would be zero current measured on 28'.

What is claimed is:

1. An device for detecting return current in a terminated conductor at the point of termination, comprising in combination:
   an annular insulative substrate;
   a metal foil on the substrate encircling the substrate central opening;
   a metal plate having a central opening affixed to one side of the the substrate covering the substrate central opening, said plate including the point of termination; and
   means interconnected with said metal foil for measuring a voltage drop across the foil width.

2. A device as in claim 1, in which the plate opening is axially located and conductor terminating means are mounted on the plate side affixed to the substrate.

* * * * *